United States Patent
Okada

(10) Patent No.: US 10,529,721 B2
(45) Date of Patent: Jan. 7, 2020

(54) METHOD AND APPARATUS FOR FORMING BORON-DOPED SILICON GERMANIUM FILM, AND STORAGE MEDIUM

(71) Applicant: TOKYO ELECTRON LIMITED, Tokyo (JP)

(72) Inventor: Mitsuhiro Okada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/472,486

(22) Filed: Mar. 29, 2017

(65) Prior Publication Data

US 2017/0287914 A1 Oct. 5, 2017

(30) Foreign Application Priority Data

Mar. 30, 2016 (JP) .................. 2016-069597

(51) Int. Cl.
| | |
|---|---|
| *H01L 27/108* | (2006.01) |
| *C23C 16/02* | (2006.01) |
| *C23C 16/22* | (2006.01) |
| *C23C 16/455* | (2006.01) |
| *C23C 16/458* | (2006.01) |
| *C23C 16/52* | (2006.01) |
| *H01L 21/02* | (2006.01) |
| *H01L 21/265* | (2006.01) |
| *H01L 49/02* | (2006.01) |

(52) U.S. Cl.
CPC ...... *H01L 27/1085* (2013.01); *C23C 16/0272* (2013.01); *C23C 16/22* (2013.01); *C23C 16/4582* (2013.01); *C23C 16/45523* (2013.01); *C23C 16/52* (2013.01); *H01L 21/0262* (2013.01); *H01L 21/02532* (2013.01); *H01L 21/02645* (2013.01); *H01L 21/26506* (2013.01); *H01L 28/00* (2013.01)

(58) Field of Classification Search
CPC .................................................... H01L 27/1085
USPC ........................................................ 438/396
See application file for complete search history.

(56) References Cited

U.S. PATENT DOCUMENTS

| | | | |
|---|---|---|---|
| 2005/0186750 A1* | 8/2005 | Lee ................... | H01L 29/66242 438/318 |
| 2011/0269315 A1* | 11/2011 | Hasebe ................... | C23C 16/22 438/758 |
| 2013/0102131 A1* | 4/2013 | Yamaguchi ......... | C23C 16/0272 438/478 |

(Continued)

FOREIGN PATENT DOCUMENTS

| | | |
|---|---|---|
| JP | 2008-53605 A | 3/2008 |
| JP | 2010-118643 A | 5/2010 |
| JP | 2011-254063 A | 12/2011 |

(Continued)

*Primary Examiner* — Mohammad M Choudhry
(74) *Attorney, Agent, or Firm* — Nath, Goldberg & Meyer; Jerald L. Meyer; Joshua B. Goldberg

(57) ABSTRACT

A method for forming a boron-doped silicon germanium film on a base film in a surface of an object to be processed includes: forming a seed layer by adsorbing a chlorine-free boron-containing gas to a surface of the base film; and forming a boron-doped silicon germanium film on the surface of the base film to which the seed layer is adsorbed by using a silicon raw material gas, a germanium raw material gas, and a boron doping gas through a chemical vapor deposition method.

13 Claims, 7 Drawing Sheets

(56) References Cited

U.S. PATENT DOCUMENTS

2015/0263095 A1 9/2015 Chan et al.
2016/0322481 A1* 11/2016 Chan .................... H01L 29/155

FOREIGN PATENT DOCUMENTS

| JP | 2012-186275 A | 9/2012 |
| JP | 2013-089889 A | 5/2013 |

* cited by examiner

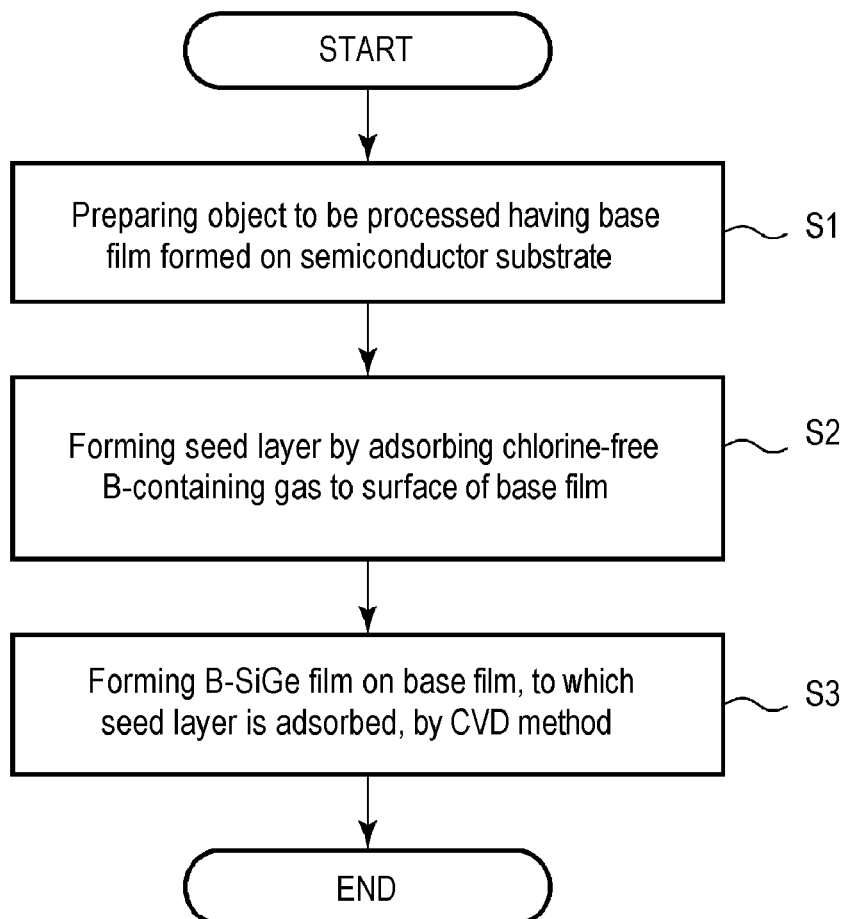

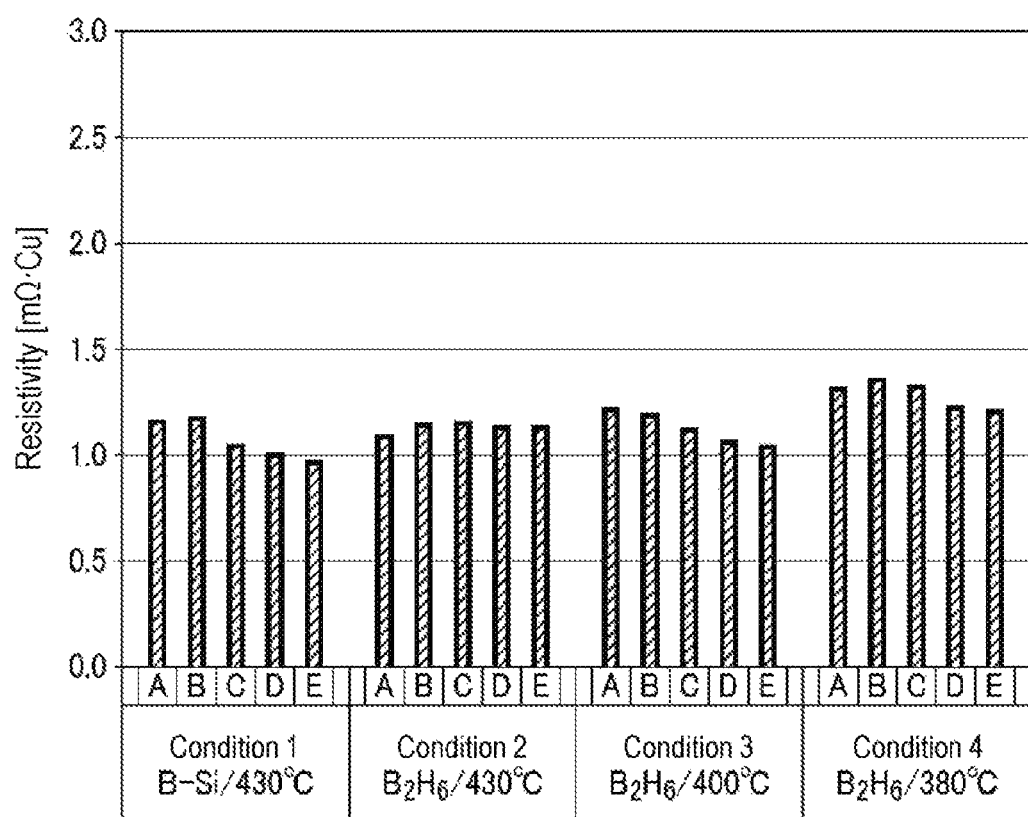

METHOD AND APPARATUS FOR FORMING BORON-DOPED SILICON GERMANIUM FILM, AND STORAGE MEDIUM

CROSS-REFERENCE TO RELATED APPLICATION

This application claims the benefit of Japanese Patent Application No. 2016-069597, filed on Mar. 30, 2016, in the Japan Patent Office, the disclosure of which is incorporated herein in its entirety by reference.

TECHNICAL FIELD

The present disclosure relates to a method and an apparatus for forming a boron-doped silicon germanium film.

BACKGROUND

In recent, with a progress of miniaturization of DRAMs (Dynamic Random Access Memories) a capacitor used in the DRAMs has a three-dimensional cylindrical structure in order to obtain a greater capacity. More specifically, the capacitor is formed by covering a surface of a lower electrode formed in a three-dimensional structure with a capacitor insulation film and by covering a surface of the capacitor insulation film with an upper electrode. In the step of forming the upper electrode, a gap is formed between adjacent capacitors. Therefore, a boron-doped silicon germanium (B—SiGe) film, which has a high conductivity and can be formed at a low-temperature, is used as a conductive layer to fill the gap.

The B—SiGe film is formed by a CVD (Chemical Vapor Deposition) method. At this time, if the B—SiGe film is formed on the upper electrode, uniformity of a film thickness distribution deteriorates significantly. Thus, in some related arts, a surface modification layer (seed layer) is formed on the upper electrode by adsorbing substances obtained by a thermal decomposition of monosilane to a surface of the upper electrode, and the B—SiGe film is formed on the surface modification layer.

In some other related arts, a germanium film is formed after a sufficient amount of boron-doped silicon film is coated on a base film, thereby growing germanium uniformly.

However, since a surface area of the B—SiGe film tends to increase with a necessity of further miniaturization of DRAMs, it is required to further suppress variation in film thickness depending on a state of the base film. Thus, a seed layer formed of the decomposed substances of monosilane as described above cannot provide a sufficient seed effect. Also, it is required to further lower a film forming temperature of the B—SiGe film.

In addition, the B—SiGe film used for DRAMs needs to be in a polycrystalline state even when the film is formed through a low-temperature film formation. However, in a case of forming the B—SiGe film after coating the base film with the boron-doped silicon film as described above, the B—SiGe film becomes an amorphous film.

SUMMARY

Some embodiments of the present disclosure provide a method and an apparatus for forming a boron-doped silicon germanium film, in which the boron-doped silicon germanium film is formed in a polycrystalline film through a low-temperature film formation while variation in film thickness depending on a state of a base film is reduced.

According to one embodiment of the present disclosure, there is provided a method for forming a boron-doped silicon germanium film on a base film in a surface of an object to be processed. The method includes: forming a seed layer by adsorbing a chlorine-free boron-containing gas to a surface of the base film; and forming a boron-doped silicon germanium film on the surface of the base film to which the seed layer is adsorbed by using a silicon raw material gas, a germanium raw material gas, and a boron doping gas through a chemical vapor deposition method.

According to another embodiment of the present disclosure, there is provided an apparatus for forming a boron-doped silicon germanium film on a base film in a surface of a substrate to be processed. The apparatus includes: a processing vessel that receives the substrate to be processed; a gas supply part that supplies a predetermined gas to an interior of the processing vessel; a heating mechanism that heats the interior of the processing vessel; an exhaust mechanism that exhausts the interior of the processing vessel to a depressurized state; and a controller that controls the gas supply part, the heating mechanism, and the exhaust mechanism. The controller controls: adjusting the interior of the processing vessel to a predetermined depressurized state by means of the exhaust mechanism and to a predetermined temperature by means of the heating mechanism; forming a seed layer by supplying a chlorine-free boron-containing gas from the gas supply part to the interior of the processing vessel in order for the chlorine-free boron-containing gas to be adsorbed to a surface of the base film; and forming a boron-doped silicon germanium film, by means of a chemical vapor deposition method, on the surface of the base film to which the seed layer is adsorbed by supplying a silicon raw material gas, a germanium raw material gas, and a boron doping gas from the gas supply part.

According to another embodiment of the present disclosure, there is provided a non-transitory computer-readable storage medium that stores a program, which is executed in a computer and controls a film forming apparatus. The program, when executed, allows the computer to control the film forming apparatus to perform the boron-doped silicon germanium film forming method described above.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating a method for forming a B—SiGe film according to an embodiment of the present disclosure.

FIG. 7 is a view showing uniformity in resistivity between wafers in experimental examples, in which the B—SiGe films are formed under Conditions 1 to 4.

DETAILED DESCRIPTION

Hereinafter, the embodiment of the present disclosure will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<B—SiGe Film Forming Method>

In a method for forming a B—SiGe film according to the present disclosure, the B—SiGe film is formed on a base film with a seed layer interposed therebetween. The following description will be made on an embodiment in which the B—SiGe film is formed on a base film which is formed on a semiconductor substrate (typically, a silicon substrate).

FIG. 1 is a flowchart illustrating a method for forming a B—SiGe film according to an embodiment of the present disclosure, and FIG. 2 is a procedural cross-sectional view thereof.

Figure 2A:
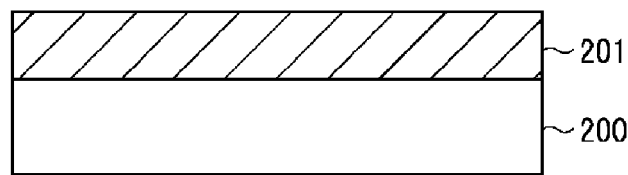
FIG. 2A to 2C are procedural cross-sectional views for explaining the method for forming the B—SiGe film according to the embodiment of the present disclosure.

First, an object to be processed having a base film 201 formed on a semiconductor substrate 200 is prepared (Step S1, FIG. 2A). An example of the base film 201 is an upper layer of a capacitor in a DRAM. In such a case, a lower electrode having a cylindrical shape, a capacitor insulation film formed on a surface of the lower electrode, and an upper electrode as the base film 201 with the capacitor insulation film interposed between the lower electrode and the upper electrode are formed on the semiconductor substrate 200, but the structure below the base film 201 is omitted in FIG. 2A. In the case where the base film 201 is an upper electrode of a capacitor in a DRAM, the base film 201 may be, for example, a TiN film formed through a CVD method. The base film 201 may be other films such as a $SiO_2$ film or the like. The object to be processed is not limited to the semiconductor substrate.

Figure 2B:
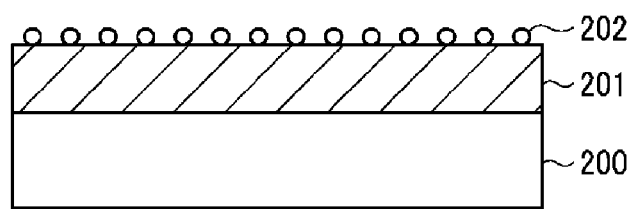

Next, a B seed gas, for example, a diborane ($B_2H_6$) gas, which is a chlorine-free boron (B)-containing gas, is supplied to the object to be processed and adsorbed to a surface of the base film 201, thereby forming a seed layer 202 (Step S2, FIG. 2B)

Since Step S2 is performed for the adsorption of boron (B), it is necessary to avoid, for example, a condition under which $B_2H_6$ is self-decomposed and participates in a CVD reaction. Accordingly, Step S2 is carried out, in some embodiments, at a low temperature of 300 degrees C. or less. In such a temperature, the $B_2H_6$ gas supplied to the object to be processed does not grow as a film. In some embodiments, a pressure in Step S2 may be in a range of 0.1 to 5 Torr (13.3 to 667 Pa).

As the chlorine-free B-containing gas constituting the B seed gas, in addition to $B_2H_6$, other borane-based gases such as $B_4H_{10}$, $B_5H_9$, $B_5H_{11}$, $B_6H_{10}$, and $B_{10}H_{14}$ may be appropriately used. A borane-based gas is a compound of B and H, and is suitable because it does not introduce impurities with respect to a B—SiGe film formed thereon. Among the borane-based gases, a $B_2H_6$ gas is particularly suitable.

Figure 2C:
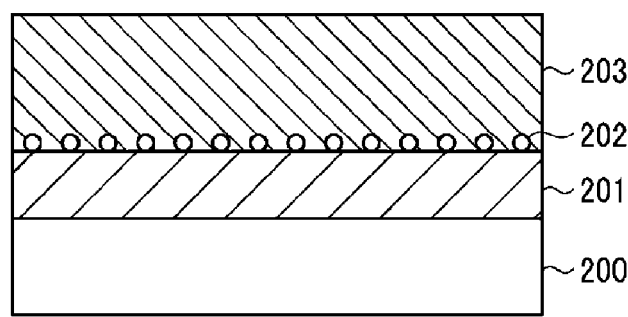

Subsequently, a B—SiGe film 203 is formed, through a CVD method, on the base film 201 to which the seed layer 202 is adsorbed (Step S3, FIG. 2C). The B—SiGe film 203 is formed in-situ after forming the seed layer 202.

The B—SiGe film 203 is formed through a CVD method by supplying a Si raw material gas, a Ge raw material gas, and a B doping gas to the object to be processed.

As the Si raw material gas, silane-based compounds such as monosilane ($SiH_4$) or disilane ($Si_2H_6$) may be appropriately used. Also, other silane-based compounds or compounds other than the silane-based compounds may be used as the Si raw material gas.

As the Ge raw material gas, germane-based compounds such as monogermane ($GeH_4$) or digermane ($Ge_2H_6$) may be appropriately used. Also, other germane-based compounds or compounds other than the germane-based compounds may be used as the Ge raw material gas.

As the B doping gas, for example, boron trichloride ($BCl_3$) or $B_2H_6$ may be appropriately used. In addition to $B_2H_6$, other B-containing gases such as $B_4H_{10}$, $B_5H_9$, $B_5H_{11}$, $B_6H_{10}$, or $B_{10}H_{14}$ may be appropriately used as the B doping gas.

In some embodiments, the B—SiGe film may be formed at 450 degrees C. or less. The B—SiGe film has a polycrystalline state and conductivity, even if it is formed at a low temperature of 450 degrees C. or less. Specifically, the temperature may be 380 to 430 degrees C. in the present embodiment. As such, the B—SiGe film can be formed at a temperature lower than 430 degrees C., for example, 380 to 400 degrees C., which is lower than a typical film forming temperature. The pressure in this process may be, in some embodiments, in the range of 0.1 to 5 Torr (13.3 to 667 Pa).

With regard to the composition of the B—SiGe film, in some embodiments, the concentration of Ge may be 20 to 90 at % and the concentration of B may be 0.1 to 20 at %.

As described above, by forming the B—SiGe film after the boron seed gas such as a $B_2H_6$ gas is adsorbed to the surface of the base film 201, it is possible to obtain a high seed effect by boron. Further, it is possible to maintain an incubation time to be constant regardless of a surface state of the base film 201, thereby significantly reducing a variation in the B—SiGe film.

In the case of forming the B—SiGe film on a TiN film, a temporal change in surface state of the TiN film by oxidation or the like is large, and a thickness of the B—SiGe film changes with an elapse of time after the formation of the TiN film. Even when the material of the base film 201 is different, the thickness of the B—SiGe film also changes. Although such a change in thickness of the B—SiGe film can be solved to some extent by means of a seed layer formed of thermally decomposed substances of monosilane as described earlier, it is not enough to meet the demand for further miniaturization.

Meanwhile, as described earlier, in the case of using a boron-doped silicon film as a seed layer, the B—SiGe film becomes an amorphous film.

In contrast, in the present embodiment, since the B seed gas such as a $B_2H_6$ gas is adsorbed to the surface of the base film 201 so as to form a seed layer 202, a high seed effect can be obtained and variation in thickness of the B—SiGe film can be reduced even though the surface state of the base film 201 varies. In addition, since the seed layer 202 is formed by adsorption, the B—SiGe film can follow the crystallinity of the base film and be formed as a polycrystalline.

Furthermore, in the related art, it is difficult to further lower a film forming temperature of the B—SiGe film because the incubation time becomes extremely longer when the film forming temperature of the B—SiGe film further decreases. However, the incubation time can be shortened by forming the seed layer 202 through the adsorption of a $B_2H_6$ gas or the like as in the present embodiment. Thus, the film formation can be performed at a temperature of less than 430 degrees C. at which the film is hardly formed in the related art, so that the film can be properly formed in the temperature range of 380 to 430 degrees C. In addition, the productivity can be improved because the incubation time is shortened.

In addition, in the case of using a $B_2H_6$ gas as the B seed gas, since impurities are not introduced into the B—SiGe film as described earlier, a high-purity film can be formed.

<Example of B—SiGe Film Forming Apparatus>

Figure 3:
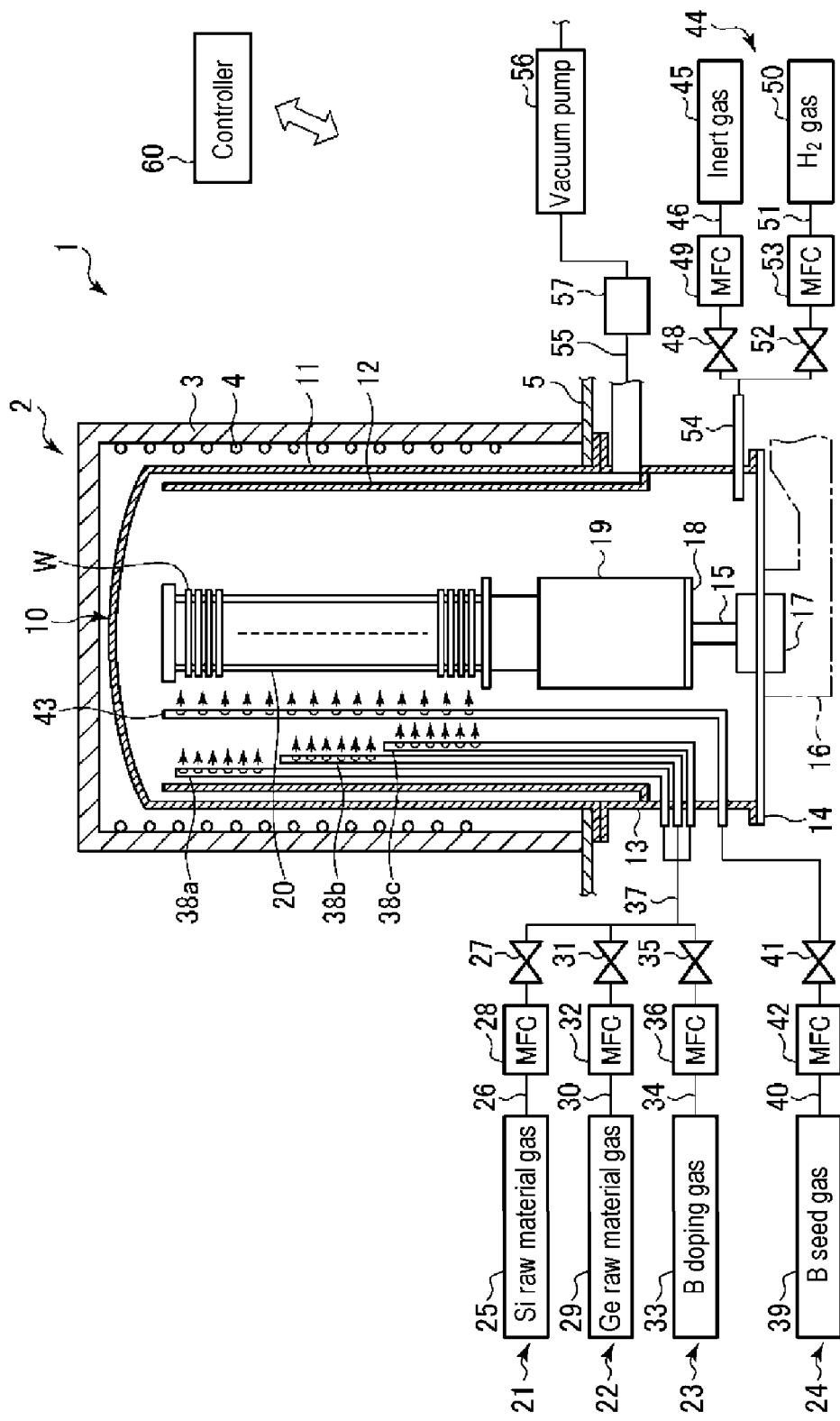
FIG. 3 is a longitudinal sectional view showing an example of a film forming apparatus that can be used for performing the B—SiGe film forming method of the present disclosure.

Next, an example of a B—SiGe film forming apparatus that can be used to perform the B—SiGe film forming method of the present disclosure will be described. FIG. 3 is a longitudinal sectional view showing a film forming apparatus as an example of the B—SiGe film forming apparatus.

A film forming apparatus 1 has a heating furnace 2 which includes a cylindrical heat-insulation body 3 having a ceiling portion, and a heater 4 installed in the inner circumferential surface of the heat-insulation body 3. The heating furnace 2 is installed on a base plate 5.

A processing vessel 10 is inserted in the heating furnace 2. The processing vessel 10 has a dual-tube structure, which includes an outer tube 11 having a closed top and made of, for example, quartz and an inner tube 12 concentrically arranged inside of the outer tube 11 and made of, for example, quartz. The heater 4 is installed to surround the outer side of the processing vessel 10.

The outer tube 11 and the inner tube 12 are supported at the lower ends thereof by a cylindrical manifold 13 made of stainless steel or the like. In the bottom opening of the manifold 13, a cap 14 for hermetically sealing the opening is installed to open and close the opening.

A rotary shaft 15 is inserted through a center portion of the cap 14 so as to be rotatable in a hermetical state by means of, for example, a magnetic seal. The lower end of the rotary shaft 15 is connected to a rotary mechanism 17 of an elevation stage 16 and the upper end of the rotary shaft 15 is fixed to a turntable 18. A wafer boat 20, which is made of quartz and holds a semiconductor wafer (hereinafter, simply referred to as "wafer") W as an object to be processed, is loaded on the turntable 18 with a thermal-insulation container 19 interposed therebetween. The wafer boat 20 is configured to receive, for example, 50 to 150 sheets of wafers W stacked by a predetermined pitch.

By moving the elevation stage 16 upward and downward by means of an elevation mechanism (not shown), the wafer boat 20 is transferred into or out of (loaded into or unloaded from) the processing vessel 10. When the wafer boat 20 is transferred into the processing vessel 10, the cap 14 comes into a close contact with the manifold 13 to thereby seal a gap therebetween.

The film forming apparatus 1 includes: a S-raw material gas supply mechanism 21 that introduces a Si raw material gas into the processing vessel 10; a Ge raw material gas supply mechanism 22 that introduces a Ge raw material gas into the processing vessel 10; a B doping gas supply mechanism 23 that introduces a B doping gas into the processing vessel 10; and a B seed gas supply mechanism 24 that introduces a B seed gas into the processing vessel 10. The film forming apparatus 1 further includes an inert gas/$H_2$ gas supply mechanism 44 that introduces an inert gas and an $H_2$ gas into the processing vessel 10. The Si raw material gas supply mechanism 21, the Ge raw material gas supply mechanism 22, the B doping gas supply mechanism 23, the B seed gas supply mechanism 24, and the inert gas/$H_2$ gas supply mechanism 44 constitute a gas supply part.

The Si raw material gas supply mechanism 21 has a Si raw material gas supply source 25 and a Si raw material gas pipe 26 that guides a film formation gas from the Si raw material gas supply source 25. An opening/closing valve 27 and a flow rate controller 28 such as a mass flow controller are installed in the Si raw material gas pipe 26 so as to supply the Si raw material gas while controlling a flow rate of the Si raw material gas.

The Ge raw material gas supply mechanism 22 has a Ge raw material gas supply source 29 and a Ge raw material gas pipe 30 that guides a Ge raw material gas from the Ge raw material gas supply source 29. An opening-closing valve 31 and a flow rate controller 32 such as a mass flow controller are installed in the Ge raw material gas pipe 30 so as to supply the Ge-raw material gas while controlling a flow rate of the Ge raw material gas.

The B doping gas supply mechanism 23 has a B doping gas supply source 33 and a B doping gas pipe 34 that guides a B doping gas from the B doping gas supply source 33. An opening/closing valve 35 and a flow rate controller 36 such as a mass flow controller are installed in the B doping gas pipe 34 so as to supply the B doping gas while controlling a flow rate of the B doping gas.

The Si raw material gas pipe 26, the Ge raw material gas pipe 30, and the B doping gas pipe 34 are joined to an integration pipe 37. Three dispersion nozzles 38a, 38b, and 38c made of quartz are branched from the integration pipe 37. The dispersion nozzles 38a, 38b, and 38c pass through a lower portion of the side wall of the manifold 13 to reach the processing vessel 10, and are bent upwards and vertically extended along the wafer boat 20 in the processing vessel 10. A plurality of gas discharge holes is formed in a vertical portion of the dispersion nozzle 38a at a position corresponding to an upper portion of the wafer boat 20. A plurality of gas discharge holes is formed in the vertical portion of the dispersion nozzle 38b at a position corresponding to a central portion of the wafer boat 20. A plurality of gas discharge holes is formed in the vertical portion of the dispersion nozzle 38c at a position corresponding to a lower portion of the wafer boat 20. With this configuration, the Si raw material gas, the Ge raw material gas, and the B doping gas are pre-mixed in the integration pipe 37, and are uniformly supplied to the wafers W in the upper portion, central portion, and lower portion of the wafer boat 20 through the dispersion nozzles 38a, 38b, and 38c, respectively. In practice, the pipes may be configured to individually control the respective discharge flow rates of the Si raw material gas, the Ge raw material gas, and the B doping gas from the dispersion nozzle 38a, 38b, or 38c.

The B seed gas supply mechanism 24 has a B seed gas supply source 39 and a B seed gas pipe 40 that guides a B seed gas from the B seed gas supply source 39. An opening/closing valve 41 and a flow rate controller 42 as a mass flow controller are installed in the B seed gas pipe 40 so as to supply the B seed gas while controlling a flow rate of the B seed gas. A dispersion nozzle 43 is connected to the B seed gas pipe 40. The dispersion nozzle 43 passes through the lower portion of the side wall of the manifold 13 to reach the processing vessel 10, and is bent upwards and vertically extended along the wafer boat 20 in the processing vessel 10. A plurality of gas discharge holes for discharging the B seed gas to the wafers W in the wafer boat 20 is formed in a vertical portion of the dispersion nozzle 43.

The inert gas/$H_2$ gas supply mechanism 44 has an inert gas supply source 45, an $H_2$ gas supply source 50, an inert gas pipe 46 that guides an inert gas from the inert gas supply source 45, a gas nozzle 54 connected to the inert gas pipe 46 and installed to pass through the lower portion of the side wall of the manifold 13, and an $H_2$ gas pipe 51 that guides an $H_2$ gas from the $H_2$ gas supply source 50 and joins the gas nozzle 54. Opening/closing valves 48 and 52 and flow rate controllers 49 and 53 as a mass flow controller are installed in the inert gas pipe 46 and the $H_2$ gas pipe 51, respectively.

As described above, various gases may be used as the Si raw material gas supplied from the Si raw material gas supply mechanism 21, and a $SiH_4$ gas will be used as an example in the following description. As described above, various gases may be used as the Ge raw material gas supplied from the Ge raw material gas supply mechanism 22, and a $GeH_4$ gas will be used as an example in the following description. As described above, various gases may be used as the B doping gas supplied from the B doping gas supply mechanism 23, and a $BCl_3$ gas will be used as an example in the following description. As described above, various gases may be used as the B seed gas supplied from the B seed gas supply mechanism 24, and a $B_2H_6$ gas will be used as an example in the following description.

A rare gas such as an $N_2$ gas or an Ar gas may be used as the inert gas supplied from the inert gas/$H_2$ gas supply mechanism 44. In the following description, an $N_2$ gas will be used as an example of the inert gas. The inert gas is used for purging, and the $H_2$ gas is used for raising the temperature.

An exhaust pipe 55 for discharging a process gases from a gap between the outer tube 11 and the inner tube 12 is connected to an upper portion of the side wall of the manifold 13. A vacuum pump 56 for exhausting the processing vessel 10 is connected to the exhaust pipe 55, and a pressure control mechanism 57 including a pressure control valve or the like is installed in the exhaust pipe 55. A pressure in the processing vessel 10 is adjusted to a predetermined value by the pressure control mechanism 57 while the processing vessel 10 is exhausted by means of the vacuum pump 56.

The film forming apparatus 1 further has a controller 60. The controller 60 includes: a main control part having a computer (CPU) for controlling respective components of the film forming apparatus 1, for example, valves, mass flow controllers as flow rate controllers, a heater power source, driving mechanisms such as the elevation mechanism, or the like; an input device such as a keyboard or a mouse; an output device such as a printer or the like; a display device such as a display or the like; and a storage device. The main control part of the controller 60 sets, in the storage device, a storage medium that stores process recipes, and executes predetermined operations in the film forming apparatus 1 based on the process recipes retrieved from the storage medium. With this configuration, the B—SiGe film forming method as described above may be performed by means of the film forming apparatus 1 under the control of the computer (CPU).

Figure 4:
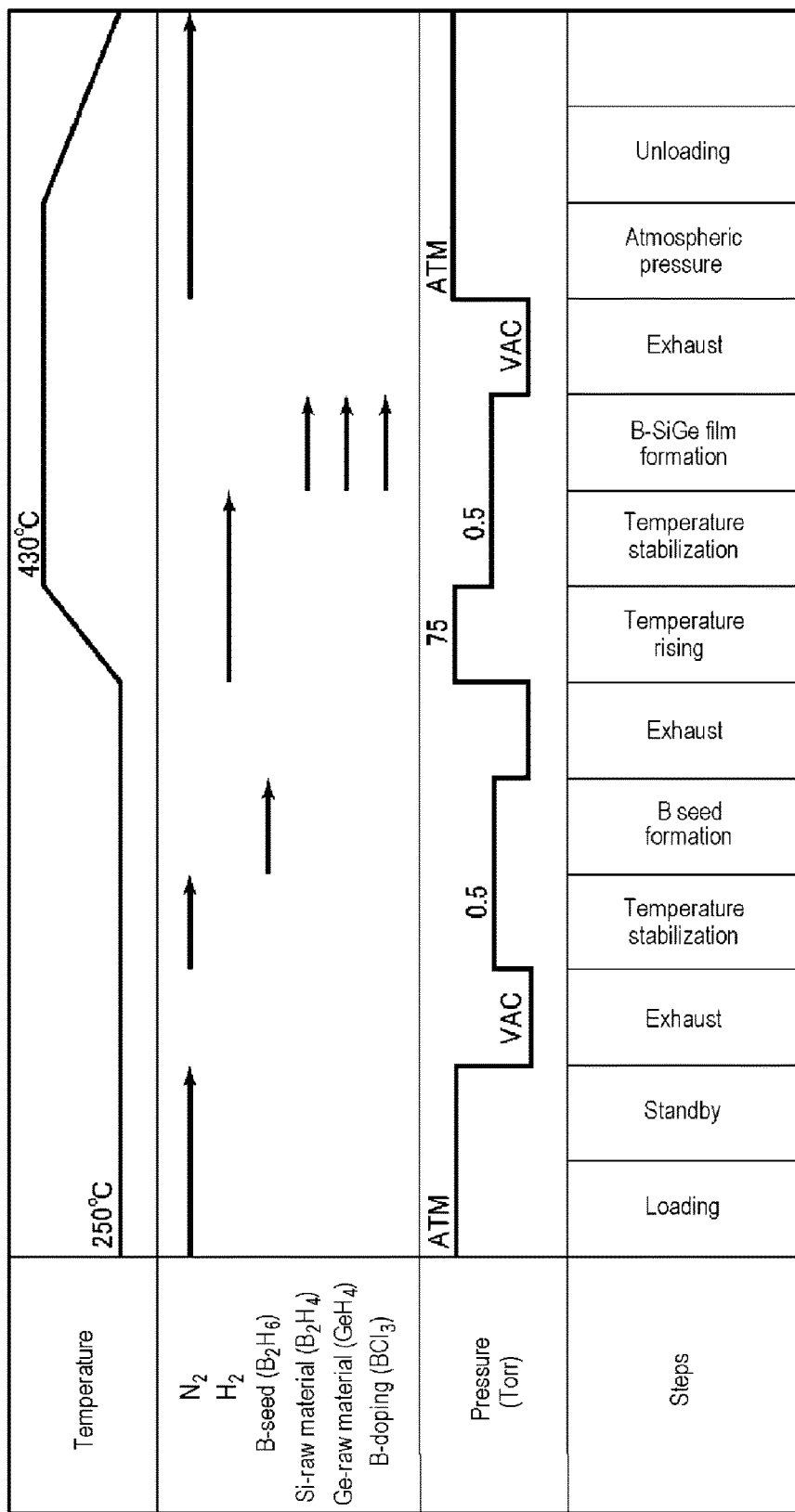
FIG. 4 is a view illustrating a process sequence of forming a B—SiGe film by means of the film forming apparatus of FIG. 3.

Next, the process operation when the aforementioned B—SiGe film forming method is performed by the film forming apparatus configured as described above will be described with reference to the process sequence diagram of FIG. 4. The following process operation is performed by the controller 60 based on the process recipes stored in the storage medium of the storage device.

First, as objects to be processed, for example, 50 to 150 sheets of wafers W, each of which has a structure in that a base film, for example, a TiN film, is formed on a semiconductor substrate, are loaded to the wafer boat 20. Then, the wafer boat 20 to which the wafers W are loaded is placed on the turntable 18 with the thermal-insulation container 19 interposed therebetween, and is transferred into the processing vessel 10 from the bottom opening by moving the elevation stage 16 upward (Loading). At this time, the output of the heater 4 is set such that a temperature of the central portion (the central portion in the vertical direction) in the wafer boat 20 becomes a seed layer formation temperature of 300 degrees C. or less, for example, 250 degrees C., and the valve 48 is opened to introduce an $N_2$ gas into the processing vessel 10 by a predetermined flow rate. The state under the above conditions is kept for a predetermined period of time (Standby). Then, the supply of the $N_2$ gas is stopped by closing the valve 48 and the processing vessel 10 is exhausted (Exhaust). Thereafter, the valve 48 is opened again to supply the $N_2$ gas into the processing vessel 10 by a predetermined flow rate until the pressure in the processing vessel 10 reaches, for example, 0.5 Torr, and the temperature in the processing vessel 10 is stabilized, for example, at 250 degrees C. (Temperature stabilization).

When the temperature in the processing vessel 10 is stabilized at 250 degrees C., the supply of the $N_2$ gas is stopped by closing the valve 48, and the valve 41 is opened to discharge a $B_2H_6$ gas from the dispersion nozzle 43 to the wafers W on the wafer boat 20 in the processing vessel 10 by a flow rate of, for example, 20 sccm (10% $B_2H_6$). Thus, boron is adsorbed to surfaces of the base films of the wafers W, thereby forming a seed layer (B seed layer formation).

After a lapse of a predetermined time, the supply of the $B_2H_6$ gas is stopped by closing the valve 41, and the processing vessel 10 is exhausted (Exhaust). Thereafter, while the valve 52 is opened to supply an $H_2$ gas into the processing vessel 10 by a predetermined flow rate such that the pressure in the processing vessel 10 is increased to 75 Torr, the output of the heater 4 increases such that the temperature of the central portion (the central portion in the vertical direction) in the wafer boat 20 becomes a B—SiGe film formation temperature of 450 degrees C. or less, for example, 430 degrees C. (Temperature rising). Then, the pressure in the processing vessel 10 is set to be, for example, 0.5 Torr and the temperature in the processing vessel 10 is stabilized (Temperature stabilization).

When the temperature in the processing vessel 10 is stabilized at 430 degrees C., the supply of the $H_2$ gas is stopped by closing the valve 52, and the valves 27, 31, and 35 are opened to discharge a $SiH_4$ gas, a $GeH_4$ gas, and a $BCl_3$ gas from the dispersion nozzles 38a, 38b, and 38c to the wafers W on the wafer boat 20 in the processing vessel 10. Thus, a B—SiGe film is formed (B—SiGe film formation). At this time, the composition of the B—SiGe film is, for example, Ge of 10 at %, B of 1 at %, and Si of 89 at %. The flow rate of each gas and the film formation time are appropriately set according to the film formation temperature and the composition and thickness of a film to be obtained. When the film formation temperature is 430 degrees C., for example, the flow rates of the $SiH_4$ gas, the $GeH_4$ gas, and the $BCl_3$ gas from the dispersion nozzles 38a, 38b, and 38c may be 1140 sccm, 3000 sccm, and 3705 sccm, respectively, and the film formation time may be 90 minutes.

After a lapse of a predetermined time, the supply of the SiH$_4$ gas, the GeH$_4$ gas, and the BCl$_3$ gas is stopped by closing the valves 27, 31, and 35, and the processing vessel 10 is exhausted (Exhaust). Then, the valve 48 is opened to supply the N$_2$ gas into the processing vessel 10 by a predetermined flow rate so as to return the pressure in the processing vessel 10 to the atmospheric pressure (Atmospheric pressure). Then, the elevation stage 16 is moved down to downwardly transfer the wafer boat 20 out of the processing vessel 10 (Unloading).

EXPERIMENTAL EXAMPLES

Next, experimental examples will be described.

Experiments were carried out using the apparatus of FIG. 3 under a conventional condition (Condition 1) in which a B—Si seed layer is formed by a CVD method using a BCl$_3$ gas and a B—SiGe film is then formed at 430 degrees C. and under conditions of the present disclosure (Conditions 2, 3, and 4) in which a B$_2$H$_6$ seed layer is formed by the adsorption of a B$_2$H$_6$ gas (10% B$_2$H$_6$) at 250 degrees C. and a B—SiGe film is then formed at temperatures of 430 degrees C., 400 degrees C., and 380 degrees C., respectively. The number of wafers loaded in the wafer boat was 125 sheets, and the target composition of the B—SiGe film was Ge of 10 at %, B of 1 at %, and Si of 89 at %.

Figure 5:
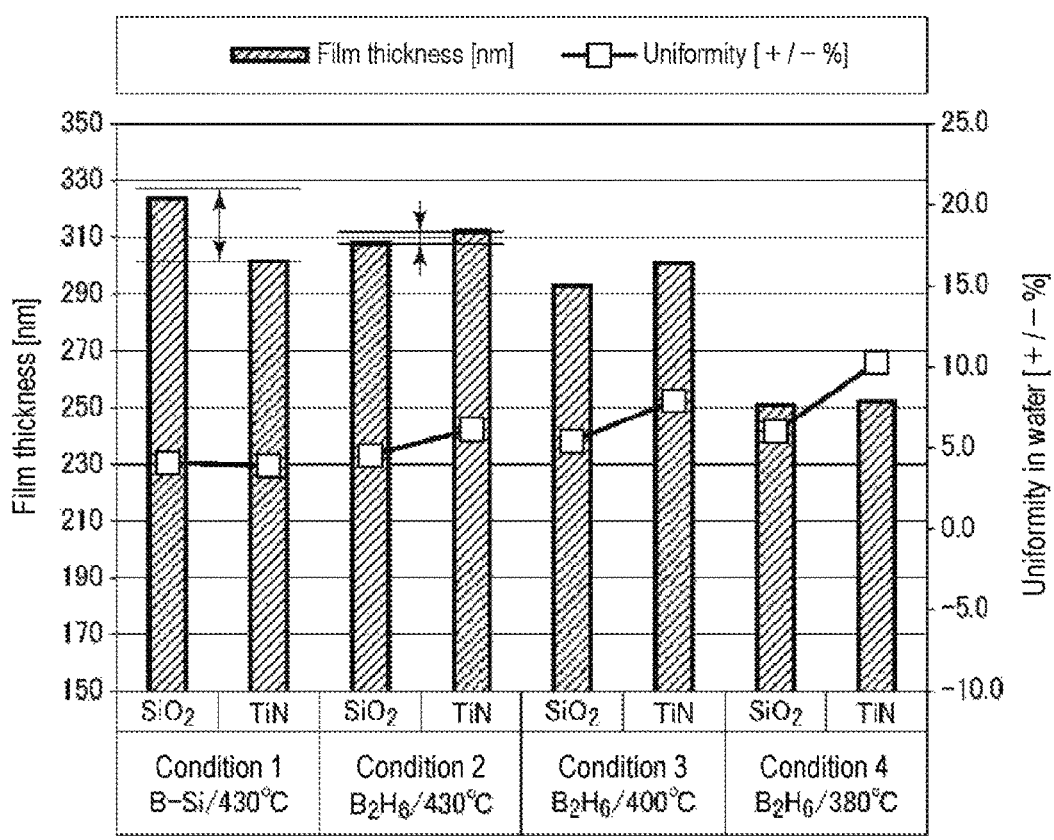
FIG. 5 is a view showing film thicknesses of B—SiGe films in experimental examples, in which the B—SiGe films are formed on a TiN film and a $SiO_2$ as base films under Conditions 1 to 4.

FIG. 5 shows film thicknesses of B—SiGe films when the B—SiGe films are formed on a TiN film and a SiO$_2$ film as base films under Conditions 1 to 4 described above.

As shown in FIG. 5, under the conventional Condition 1, a large amount of difference in the film thickness was generated by the difference in types of the base films, whereas under Condition 2 of the present disclosure in which a B—SiGe film was formed at the same temperature as that in Condition 1, the difference in film thickness due to the types of the base films was very small. From this, it was confirmed that the difference in film thickness of the B—SiGe film due to the different in types of the base films is hardly generated by using a seed layer formed by the adsorption of B$_2$H$_6$ according to the present disclosure.

In addition, as shown in FIG. 5, it was confirmed that even under Conditions 3 and 4 of the present disclosure in which the B—SiGe film formation temperature was adjusted to 400 degrees C. and 380 degrees C., respectively, which are lower than that in the conventional condition, the film can be formed without generating a large amount difference in film thickness due to the different in types of the base films.

Uniformity in film thickness between wafers in the wafer boat was also checked for the cases of forming the B—SiGe film under Conditions 1 to 4. Here, five wafers were extracted from predetermined positions (A, B, C, D, and E) from top to bottom in the wafer boat and film thicknesses of the wafers were measured. The result is shown in FIG. 6.

Figure 6:
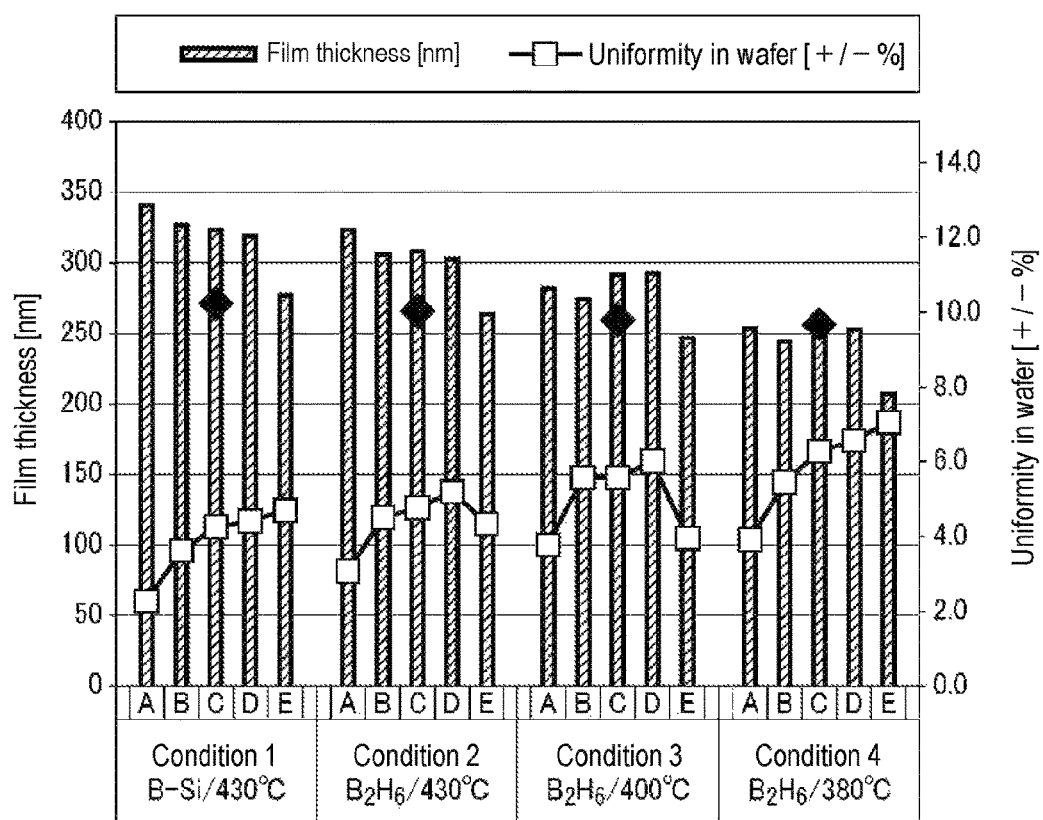
FIG. 6 is a view showing uniformity in film thickness between wafers in experimental examples, in which the B—SiGe films are formed under Conditions 1 to 4.

As shown in FIG. 6, comparing Conditions 1 and 2 having the same film formation temperature, the film thickness uniformity between wafers in Condition 2 was better than that in Condition 1. With regard to Conditions 3 and 4 having lowered film formation temperatures, the film thicknesses of the wafers in the bottom position were thin, but the difference in film thickness was not large.

Uniformity in resistivity between wafers in the wafer boat was also checked for the cases of forming the B—SiGe film under Conditions 1 to 4. Here, like the experiment described above, five wafers were extracted from predetermined positions (A, B, C, D, and E) from top to bottom in the wafer boat, and a resistivity of each wafer was measured. The result is shown in FIG. 7.

As shown in FIG. 7, comparing Conditions 1 and 2 having the same film formation temperature, the resistivities and uniformities were equal. With regard to Conditions 3 and 4 having lowered film formation temperatures, the resistivities were increased slightly, but the values and variations were within an allowable range.

<Other Applications>

Hereinabove, although the embodiments of the present disclosure have been described, the present disclosure is not limited to the embodiments above, and may be modified variously without departing from the scope of the present disclosure.

For example, although the TiN film is used as the base film in the embodiment above, the present disclosure is not limited thereto and can be applied to a case in which the B—SiGe film is formed on various base films. In addition, although the method of the present disclosure is performed using a vertical batch type apparatus in the embodiment above, the present disclosure is not limited thereto, and the method may be performed using other various film forming apparatuses such as a horizontal batch type apparatus or a single wafer type apparatus.

According to the present disclosure, since a seed layer is formed on a base film by the adsorption of a boron-containing gas such as a diborane gas, it is possible to obtain a high seed effect and reduce variation in film thickness depending on a state of the base film. In addition, since the seed layer is formed by the adsorption of the boron-containing gas, the incubation time can be shortened, which allows a low-temperature film formation. In addition, since the seed layer is formed by means of adsorption, a boron-doped silicon germanium film can be formed in a polycrystalline film without losing continuity from the base film. Furthermore, in the case of using a B$_2$H$_6$ gas as the boron-containing gas, since impurities are not introduced to the boron-doped silicon germanium film, a high purity film can be obtained.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for forming a polycrystalline boron-doped silicon germanium film on a base film formed on a surface of an object to be processed, the method comprising:

forming a seed layer by adsorbing a diborane gas to a surface of the base film at a temperature of 300 degrees C. or less; and forming the polycrystalline boron-doped silicon germanium film on the surface of the base film to which the seed layer is adsorbed by using a silicon raw material gas, a germanium raw material gas, and a boron doping gas through a chemical vapor deposition method.

2. The method of claim 1, wherein the object to be processed has a TiN film, which constitutes the base film, formed on the surface of the object to be processed.

3. The method of claim 1, wherein the seed layer is formed at a temperature of 250 to 300 degrees C.

4. The method of claim 1, wherein in the act of forming the boron-doped silicon germanium film, a silane-based compound is used as the silicon raw material gas and a germane-based compound is used as the germanium raw material gas.

5. The method of claim 4, wherein the silane-based compound is monosilane or disilane, and the germane-based compound is monogermane or digermane.

6. The method of claim 1, wherein the boron doping gas is a boron trichloride gas or a diborane gas.

7. The method of claim 1, wherein the boron-doped silicon germanium film is formed at a temperature of 450 degrees C. or less.

8. The method of claim 7, wherein the boron-doped silicon germanium film is formed at a temperature of 380 to 430 degrees C.

9. The method of claim 8, wherein the boron-doped silicon germanium film is formed at a temperature of 380 to 400 degrees C.

10. The method of claim 1, wherein the boron-doped silicon germanium film has a germanium concentration of a range from 20 to 90 at %.

11. An apparatus for forming a polycrystalline boron-doped silicon germanium film on a base film formed on a surface of a substrate to be processed, the apparatus comprising:
a processing vessel that receives the substrate to be processed;
a gas supply part that supplies a predetermined gas to an interior of the processing vessel;
a heating mechanism that heats the interior of the processing vessel;
an exhaust mechanism that exhausts the interior of the processing vessel to a depressurized state; and
a controller that controls the gas supply part, the heating mechanism, and the exhaust mechanism,
wherein the controller controls by:
adjusting the interior of the processing vessel to a predetermined depressurized state by means of the exhaust mechanism and to a predetermined temperature by means of the heating mechanism;
forming a seed layer by supplying a diborane gas from the gas supply part to the interior of the processing vessel in order for the diborane to be adsorbed to a surface of the base film at a temperature of 300 degrees C. or less; and
forming the polycrystalline boron-doped silicon germanium film, by means of a chemical vapor deposition method, on the surface of the base film to which the seed layer is adsorbed by supplying a silicon raw material gas, a germanium raw material gas, and a boron doping gas from the gas supply part.

12. The apparatus of claim 11, wherein the processing vessel receives a substrate holder that holds a plurality of substrates to be processed and processes the plurality of substrates to be processed.

13. A non-transitory computer-readable storage medium that stores a program, which is executed in a computer and controls a film forming apparatus, wherein the program, when executed, allows the computer to control the film forming apparatus to perform the polycrystalline boron-doped silicon germanium film forming method of claim 1.

* * * * *